United States Patent [19]

Grossa et al.

[11] Patent Number: 5,399,458
[45] Date of Patent: Mar. 21, 1995

[54] PROCESS FOR MAKING IMAGES EMPLOYING A TONER WHICH HAS A TACKINESS THAT CAN BE INCREASED BY ACTINIC RADIATION

[75] Inventors: Mario Grossa, Dreieich; Dieter Tigler, Rodermark; Bernhard Metzger; Paola Gallo, both of Darmstadt, all of Germany

[73] Assignee: E. I. Du Pont de Nemours and Company, Wilmington, Del.

[21] Appl. No.: 104,315

[22] Filed: Aug. 10, 1993

[30] Foreign Application Priority Data

Aug. 25, 1992 [DE] Germany ............... 42 28 141.5

[51] Int. Cl.6 .................. G03G 9/00; G03C 11/12
[52] U.S. Cl. .................... 430/257; 430/110; 430/254; 430/291; 430/293; 430/965
[58] Field of Search .............. 430/291, 199, 257, 254, 430/102, 110, 293, 965

[56] References Cited

U.S. PATENT DOCUMENTS

| | | | |
|---|---|---|---|
| 3,060,025 | 10/1962 | Burg et al. | 96/28 |
| 3,582,327 | 6/1971 | Boyd et al. | 96/28 |
| 3,620,726 | 11/1971 | Chu et al. | 96/27 |
| 3,630,736 | 12/1971 | Cescon et al. | 96/48 |
| 3,649,268 | 3/1972 | Chu et al. | 96/27 |
| 3,909,282 | 9/1975 | Gray | 106/288 |
| 4,215,193 | 7/1980 | Manger et al. | 430/291 |
| 4,243,741 | 1/1981 | Abele et al. | 430/270 |
| 4,294,909 | 10/1981 | Lee | 430/291 |
| 4,346,162 | 8/1982 | Abele | 430/270 |
| 4,356,252 | 10/1982 | Lee | 430/270 |
| 4,356,253 | 10/1982 | Buzzell | 430/291 |
| 4,358,529 | 11/1982 | Abele | 430/270 |
| 4,461,822 | 7/1984 | Abele | 430/291 |
| 4,604,340 | 8/1986 | Grossa | 420/270 |
| 4,608,329 | 8/1986 | Geisler | 430/291 |
| 4,806,451 | 2/1989 | Frohlich | 430/291 |
| 4,869,996 | 9/1989 | McCartin et al. | 430/286 |
| 4,876,172 | 10/1989 | Hillenbrand | 430/253 |
| 4,892,802 | 1/1990 | Bauer et al. | 430/270 |
| 4,902,363 | 2/1990 | Delaney et al. | 156/230 |
| 4,939,029 | 7/1990 | Delaney et al. | 428/314.4 |
| 4,948,704 | 8/1990 | Bauer et al. | 430/291 |
| 4,953,331 | 6/1990 | Platzer et al. | 430/254 |
| 5,126,226 | 6/1992 | Frohlich | 430/257 |

FOREIGN PATENT DOCUMENTS 2032051 12/1990 Canada .
2039070 7/1980 United Kingdom .

*Primary Examiner*—Charles L. Bowers, Jr.
*Assistant Examiner*—John S. Chu

[57] ABSTRACT

A process for preparing images, particularly color proof prints, in which tacky and non-tacky areas are produced by imagewise exposure of a radiation-sensitive layer is described. The tacky areas are toned with a toner having a tackiness that can be increased by irradiation with actinic radiation.

19 Claims, No Drawings

PROCESS FOR MAKING IMAGES EMPLOYING A TONER WHICH HAS A TACKINESS THAT CAN BE INCREASED BY ACTINIC RADIATION

FIELD OF THE INVENTION

This invention relates to a process for preparing images, and in particular to a process for preparing color proof prints, using radiation-sensitive coatings having a tackiness that can be modified by irradiation with actinic radiation and toner materials having a tackiness that can be increased by irradiation with actinic radiation.

BACKGROUND OF THE INVENTION

Halftone color separations are used in reprography as copy originals for making offset and letterpress printing plates. The color separations are checked prior to exposing with the aid of color proofing processes to determine whether the ultimate printing result will be a tonally correct reproduction of the original.

Such color proofing processes use photosensitive recording materials whereby upon exposure to actinic radiation, an image is produced due to differences in the tackiness of the exposed and unexposed areas of the photosensitive coating. Colored toners are then applied to the tacky areas after imagewise exposure.

The toners are predominantly finely divided powders, and are applied by dusting onto the imagewise exposed surface. These toners are disclosed, for example, in U.S. Pat. No. 4,215,193 issued Jul. 29, 1980; and U.S. Pat. No. 3,909,282 issued Sep. 30, 1975. Alternatively, the toner can be loosely bonded to a separate support to form a coated transfer material which is brought into contact with the imagewise exposed layer. Such transfer materials are disclosed in U.S. Pat. No. 3,060,025 issued Oct. 23, 1962; German Patent 29 49 462-C published Jun. 19, 1980; U.S. Pat. No. 4,806,451 issued Feb. 21, 1989; U.S. Pat. No. 4,902,363 issued Feb. 20, 1990; U.S. Pat. No. 4,939,029 issued Jul. 3, 1990; U.S. Pat. No. 5,126,226 issued Jun. 30, 1992; German Patent 39 41 493-C published May 2, 1991; and U.S. Pat. No. 4,935,331 issued Jun. 19, 1990.

Reproduction processes suitable for making positive color images of exposed originals are disclosed in German Patent 12 10 321-C (U.S. Pat. No. 3,620,726, issued Nov. 16, 1971); U.S. Pat. No. 3,582,327 issued Jun. 1, 1971; U.S. Pat. No. 3,649,268 issued Mar. 14, 1972; U.S. Pat. No. 4,356,253 issued Oct. 26, 1982; U.S. Pat. No. 4,892,802 issued Jan. 9, 1990; and U.S. Pat. No. 4,948,704 issued Aug. 14, 1990. In these processes, a tacky, photopolymerizable recording material, comprising a support and a photopolymerizable coating containing at least one addition-polymerizable monomer and a photopolymerization initiator, is hardened by imagewise exposure whereby the exposed areas lose their tackiness. The latent image is then made visible by applying a toner that adheres only to the unexposed, tacky areas. Excess toner remaining on the exposed, non-tacky image areas is removed after application.

Negative images of exposed originals are obtained with such photopolymerizable materials according to the process disclosed in U.S. Pat. No. 4,869,996 issued Sep. 26, 1989, wherein the tacky, unexposed areas of the imagewise exposed material are covered with a colorless powder. The entire material is then heated until the exposed, photopolymerized areas become tacky and can be colored with a toner. However, this process requires two additional process steps.

Negative images of the original can be made directly by using the photosensitive materials disclosed in U.S. Pat. No. 4,243,741 issued Jan. 6, 1981; U.S. Pat. No. 4,346,162 issued Aug. 24, 1982; U.S. Pat. No. 4,358,529 issued Nov. 9, 1982; U.S. Pat. No. 4,604,340 issued Aug. 5, 1986; U.S. Pat. No. 4,294,909 issued Oct. 13, 1981; and U.S. Pat. No. 4,356,252 issued Oct. 26, 1982. The tackiness of these materials is increased by irradiation with actinic radiation. These recording materials contain either a dihydropyridine compound or a photosensitive system of a hexaaryl-bisimidazole compound and a dihydropyridine compound or a thioamide or thiolactam. Hexaarylbisimidazoles are also disclosed in combinations with leuco dyes in German Patent C 13 00 013. The advantage of using materials that become tacky on exposure is that several colors can be applied together by repeated exposure through different originals and subsequent toning with different toners.

U.S. Pat. No. 4,876,172 issued Oct. 24, 1989 discloses a process in which microparticle layers that become tacky on exposure can also be toned, after imagewise exposure, by being brought into contact with a receptor so that only the exposed areas are transferred.

U.S. Pat. No. 4,461,822 issued Jul. 24, 1984 describes a process to increase the density or modify the color of imagewise toned surfaces by multiple applications of different powdered toners that become tacky on contact with each other.

However, no process is known for making toned polychromatic negative images with overlapping areas of different colors on a single photosensitive recording layer. Making such polychromatic images requires application of a new photosensitive layer onto the already toned layers, followed by imagewise exposure, and a subsequent toning step. The color overlap required for the resulting proof print cannot be achieved otherwise. Also, exact registration of the individual monochromatic images with each other is particularly difficult. In addition, such multi-step processes are very time-consuming and can lead to color inaccuracies because the photosensitive layer for each color remains within the proof print.

Accordingly, the present invention enables one to make polychromatic images, especially negative color proof prints, with overlapping color areas without the need to transfer exposed image areas or the addition of other intermediate steps.

SUMMARY OF THE INVENTION

This invention relates to a process for preparing images by:
A) applying a radiation-sensitive layer A, having a tackiness that can be modified by irradiation with actinic radiation, onto a support;
B) irradiating imagewise with actinic radiation the radiation-sensitive layer A, the tackiness of which is modified in predetermined areas;
C) applying onto the irradiated layer A a toner that adheres to the tacky areas of the layer; and
D) removing excess toner from the untoned areas of the layer.

The toner used in the process of the invention has a tackiness that can be increased by irradiation with actinic radiation.

DETAILED DESCRIPTION OF THE INVENTION

The use of photosensitive toners in the process of the invention was not thought to produce satisfactory images because of the risk of increased contamination of non-image areas by a toner having latent tackiness and the consequent increase in background stain. There was also the risk that a difference in photosensitivity between the toned areas and the basic material may exist. Such a difference would require using different exposure times.

However, surprisingly and unexpectedly, very satisfactory images were obtained in the present process using photosensitive toners having a tackiness that is modified by irradiation with actinic radiation. These images fulfill the requirements for a color proofing process, in that they have (a) exact tonal reproduction, (b) absence of background stain, (c) high resolution, and (d) overlapping color areas.

Another advantage of using photosensitive toners in the process of the invention is that a protective layer can be applied easily and with good adhesion. This is achieved by an overall final exposure of the image followed by a subsequent lamination of a protective layer. Moreover, the originals for exposure can often be placed directly on the layer to be exposed. A protective layer to prevent the original from adhering to the image support is then not necessary, and this contributes to higher resolution.

The toners used in the process of the invention can be powdered toners or coated transfer materials. Particularly advantageous is the use of coated transfer materials analogous to the materials described in for example, German Patent C 36 25 014 and German Patent C 39 41 493. The high color densities required in the printing industry are easily and reproducibly achieved using these transfer coatings. In addition, the risk of contaminating non-image areas is very low with these toner materials.

The toners used in the process of the invention can also be used advantageously as coated transfer materials comprising separate layers. A first layer on the support contains the photosensitive material. A layer containing the chromogenic material is present on the photosensitive material and is transferred by contact with the surface of the imagewise exposed material. The use of this multilayer material is advantageous because the photosensitivity is not dependent on the chromogenic material. This material also offers a wider use latitude, for example, for base layers having a high plasticizer content, which otherwise could intensify background stain. If required, an intermediate layer to improve adhesion can be present between the two layers.

An essential component of the toners used in the process of the invention are (a) radiation-sensitive materials having a tackiness that is increased by irradiation with actinic radiation, and (b) a chromogenic material.

The radiation-sensitive material can be, for example, photodepolymerizable mixtures containing primarily polyaldehydes, polycarbonates or polyolefins as the essential components. It is advantageous to use compounds that, on irradiation, release an acid that degrades the polymer. Also suitable are the mixtures described in EP-B 00 31 566 (U.S. Pat. No. 4,294,909) of polymers and photodegradable acetates, the degradation products of which plasticize the polymers.

Toners preferred in practicing the invention use radiation-sensitive materials containing photosensitive dihydropyridines or a photosensitive system of a hexaaryl-bisimidazole and a dihydropyridine compound or a thioamide or thiolactam. Suitable dihydropyridine systems are described in German Patent C 34 29 615 (U.S. Pat. No. 4,604,340). Hexaarylbisimidazole systems combined with thioamides or thiolactams are described in German Patent C 30 23 247 (U.S. Pat. No. 4,346,162). Materials described in German Patent C 30 48 490 (U.S. Pat. No. 4,358,529) and German Patent C 27 58 209 (U.S. Pat. No. 4,243,741) containing dihydropyridines and hexaaryl-bisimidazoles are especially preferred.

Examples of suitable photosensitive dihydropyridines are dihydropyridines substituted in the 4 position with a 2'-nitrophenyl group, as described in German Patent C 34 29 615 (U.S. Pat. No. 4,604,340). Examples of preferred compounds are the mono and di versions of methyl, ethyl, and i-propyl esters of 3,5-dicarboxy-4-(2'-nitrophenyl)-2,6-dimethyl-1,4-dihydropyridine, 3,5-dicarboxy-4-(2'-nitro-4',5'-dimethoxyphenyl)-2,6-dimethyl-1,4-dihydropyridine, 5-carboxy-3-aceto-4-(2'-nitrophenyl)-2,6-dimethyl-1,4-dihydropyridine, 3,5-diaceto-4-(2'-nitrophenyl)-2,6-dimethyl-1,4-dihydropyridine, and 3,5-dicyano-4-(2'-nitrophenyl)-2,6-dimethyl-1,4-dihydropyridine.

The following dihydropyridines combined with hexaarylbisimidazoles are especially preferred: 3,5-bis(ethoxycarbonyl)-2,4,6-trimethyl-1,4-dihydropyridine (methyl-DHP), 3,5-bis(ethoxycarbonyl)-4-ethyl-2,6-dimethyl-1,4-dihydropyridine (ethyl-DHP), 3,5-bis(ethoxycarbonyl)-4-propyl-2,6-dimethyl-1,4-dihydropyridine (propyl-DHP), 3,5-bis(ethoxycarbonyl)-4-phenylmethyl-2,6-dimethyl-1,4-dihydropyridine.

The dihydropyridine compounds are used in the toners in quantities of 5 to 40 percent by weight, preferably 10 to 30 percent by weight, relative to the total toner composition.

Suitable hexaarylimidazoles are substituted in the 2, 4 and 5 position of the imidazole rings with the same or different aryl groups and the aryl groups can also bear substituents. The hexaarylbisimidazoles named in DE-C 13 00 013 can be used. Preferred compounds are 2,2',4,4',5,5'-hexaphenyl-1,1'-bi-1H-imidazole, 2,2'-bis (o-chlorophenyl)-4,4',5,5'-tetraphenyl-1,1'-bi-1H-imidazole, 2,2'-bis(o-chlorophenyl)-4,4',5, 5'-tetrakis-(m-methoxyphenyl)- 1,1'-bi-1H-imidazole (CDM-HABI) and 2,2'-bis-(o-ethoxyphenyl)-4,4',5,5'-tetraphenyl-1,1,'-bi-1H-imidazole (ethoxy-HABI).

The hexaarylbisimidazole compounds are used in the toners in quantities of 10 to 70 percent by weight, preferably 25 to 60 percent by weight, relative to the total toner composition.

The chromogenic materials can be finely divided powders disclosed in the literature as suitable for image recording, for example, in German Patent C 19 04 059 and German Patent C 29 46 896. These powders are predominantly pigments, but dissolved dyes combined with a finely divided powder are also useful. Examples are inorganic and organic pigments, fluorescent materials, metal powders in the pure form or combined with a powdered organic or inorganic carrier, such as titanium dioxide, glass powder, carbon black or graphitic carbon, metal phthalocyanines, azo dyes, metal powders of aluminum, copper, iron, gold or silver, or metal oxides. The use of a mixture of pigment and $SiO_2$ is particularly advantageous.

The chromogenic material is used in the toner in quantities of 10 to 70 percent by weight, preferably 20 to 50 percent by weight, relative to the entire toner material.

Preferred toners, particularly for use in color transfer materials, contain a polymeric binder in addition to the photosensitive material and the chromogenic material. Binders useful within the scope of the invention can be selected from among thermoplastic polymers. Suitable examples are polyacrylic acid esters, polymethacrylic acid esters, copolymers with acrylic or methacrylic acid or other acrylic or vinyl monomers, copolymers of maleic acid anhydride and of maleic acid or its diesters or half esters with styrene or other vinyl monomers, vinyl polymers or copolymers containing chlorine, such as, for example, polyvinyl chloride, polyvinylidene chloride, chlorinated polyethylene, etc., synthetic rubbers based on butadiene, chloroprene, etc., and their copolymers, for example with styrene, acrylonitrile, etc., and polyethers, such as, for example, high molecular weight polyethylene oxides or polyepichlorohydrin, etc. The binders can be used in the toners in quantities of 5 to 60 percent, preferably 10 to 40 percent by weight, relative to the total toner material.

In addition to the components already named, the toners can contain optionally other additives, such as, for example, sensitizers, stabilizers, matting agents, coating auxiliaries, or others. Benzophenone or Michler's ketone have been proven to be especially useful, among others, as sensitizers.

Toners used in the process of the invention can also be prepared for use as powdered toner by dissolving the chromogenic and photosensitive materials together in a suitable solvent, preferably acetone, and subsequent precipitation with water. The toner can also be prepared by precipitating the photosensitive material from acetone with water and mixing the precipitate with the photosensitive system by known processes, such as are described in German Patent C 29 46 896 (U.S. Pat. No. 4,215,193). Binders or other additives are then added to the photosensitive material.

Toners for use as transfer layers are prepared by the methods disclosed, for example, in German Patent C 36 25 014 (U.S. Pat. No. 4,806,451) and German Patent C 39 41 493. The binder and the chromogenic material are premixed and the photosensitive material is then added.

If the toner is used as a multilayer transfer material, a first coating solution containing the photosensitive material is coated onto the support and dried. After drying, the resulting photosensitive layer is coated with a second layer containing the chromogenic material. The photosensitive layer is prepared preferably from the materials and by the method disclosed in German Patent C 27 58 209 (U.S. Pat. No. 4,243,741) or German Patent C 34 29 615 (U.S. Pat. No. 4,604,340). Known pigmented transfer layers, as described, for example, in German Patent C 36 25 014 (U.S. Pat. No. 4,806,451) and German Patent C 39 41 493, or pigmented transfer sheets that melt when heated can be used as the color layer. An adhesive layer is used, if desired, between the photosensitive layer and the pigmented layer.

The transfer materials used in the process of the invention can have a protective cover sheet that is stripped off before appropriate use.

The coating composition for preparing the transfer layer is applied by known methods to a suitable support and then dried. Mixtures in organic solvents are preferred for coating on the support. Suitable supports include particularly papers and synthetic resin sheets of polyesters, polyamides, polyethylene, polypropylene, polyvinyl chloride, and the like. Compressible materials, as described in German Patent C 37 06 528 (U.S. Pat. No. 4,902,363), are especially advantageous.

The dried coating can be up to 8 $\mu$m, and preferably up to 5 $\mu$m thick. Very thin coatings less than 3 $\mu$m, and preferably 0.4–1.5 $\mu$m thick, are especially preferred.

INDUSTRIAL APPLICABILITY

The process of the invention can be used advantageously for reproducing line or halftone images for use in the graphic arts and other industrial fields, to prepare geographic maps, advertising circulars, posters, illuminated letters, and printed circuit boards. A main field of use is preparing polychromatic images and color proofing.

A color proof is made in accordance with the process of the present invention as follows: A colorless, photosensitive material existing as a laminate consisting of (a) a photosensitive layer, which becomes tacky on irradiation with actinic radiation, (b) a support sheet, and (c) a cover sheet, is applied to an image receptor after removal of the cover sheet. The resulting structure is exposed to actinic radiation through the transparent support with a halftone color separation negative of a first color as the original to form tacky and non-tacky areas. The negative tonable materials disclosed in German Patent C 27 58 209 (U.S. Pat. No. 4,243,741), German Patent C 30 23 247 (U.S. Pat. No. 4,346,162) and German Patent C 3 429 615 (U.S. Pat. No. 4,604,340) can be used as the preferred photosensitive material. These systems contain, as photosensitive components, either a photosensitive dihydropyridine compound or a mixture of a dihydropyridine compound and a hexaarylbisimidazole compound, and are preferred for use in the process of the invention.

The photosensitive materials of the base layer as well as of the toner have their maximum sensitivity in the ultraviolet range, preferably in the wavelength range between 250 and 450 nm. All radiation sources delivering an effective amount of this radiation are suitable for exposure, for example, xenon lamps, mercury vapor lamps, carbon arc lamps, lasers, fluorescent lamps emitting ultraviolet radiation, and electronic flash devices.

After the support is removed from the base layer, a photosensitive toning layer, for example, cyan, is laminated on the exposed layer and stripped off, yielding a color image of the original. The color separation for the second color is placed on the image resulting from the first color separation and exposed. The exposed areas, i.e., the untoned base layer or pigment layer of the first color, become tacky again and can be toned by laminating and subsequently stripping off a second pigmented, photosensitive transfer layer (for example, magenta). The same procedure can be repeated for yellow and black to obtain a four-color image. The last color layer applied need not be photosensitive, because there is no additional color application.

However, it is advantageous for the last color layer to also be photosensitive, because the entire surface of the polychromatic proof print can be made tacky by an overall final exposure. Thus, a stable protective coating can be easily applied.

The toners used in the process of the invention can also be used advantageously to tone photopolymerizable base layers, such as, for example, those used in EP-A 02 43 933 for making positive color proof prints.

In this application, multiple toning, for example, to increase color density or to modify color tone, is possible. A final protective layer can also be applied easily and with good adhesion in this instance.

EXAMPLES

The following examples illustrate the invention. Parts and percentages are by weight, unless otherwise stated.

EXAMPLE 1 (a)

The following constituents were dissolved successively in butanone/toluene (1:1) with stirring to prepare an unpigmented base layer that becomes tacky on exposure:

Poly(ethyl acrylate) I (25% solution in ethyl acetate, Brookfield viscosity at 20° C.=5,000–10,000 mPas-)—19.13%

Poly(ethyl acrylate) II (30% solution in ethyl acetate, Brookfield viscosity at 20° C.=7,000–12,000 mPas-)—15.65%

Polystyrene, tensile strength (DIN 53455)=46 N/nm$^2$ —6.96%

CDM-HABI—13.04%
o-Ethoxy-HABI—24.35%
Methyl-DHP—6.38%
Ethyl-DHP—6.38%
Propyl-DHP—6.38%
Stabilizer—1.73%

The solids content of the solution was 10% by weight.

The solution was coated on the support with a spiral doctor blade. The coating thickness was about 5 μm. The coating could be used after drying at room temperature.

EXAMPLE 1 (b)

To prepare a color transfer layer to be used in the process of the invention, 4.67 g polystyrene of Example 1a), 14.01 g poly(ethyl acrylate) II of Example 1a), and 18.99 g poly(ethyl acrylate) I of Example 1a) were dissolved in toluene/methyl ethyl ketone (1:1). 21.25 g cyan pigment based on copper phthalocyanine (C.I. 74160) and 2.33 g surfactant were milled together separately and added to the binder solution. Then, 8.64 g CDM-HABI, 16.11 g ethoxy-HABI, 4.28 g ethyl-DHP, 4.28 g methyl-DHP, 4.28 g propyl-DHP, and 1.17 g stabilizer were added and the mixture was stirred for about one hour. The composition was coated on a 60 μm thick polypropylene foam sheet according to DE-OS 37 06 528 and yielded a 0.45 μm thick layer after drying.

EXAMPLE 1 (c)

To prepare a color image, a negative, tonable layer prepared according to (a) was laminated, after the cover sheet was removed, on an image receptor and exposed for 42 seconds through a halftone cyan color separation in a vacuum printing frame with a metal halide lamp (3,000 W) using a UV filter at a distance of 95 cm. After the support was removed, the transfer layer prepared according to (b) was laminated on the imagewise exposed layer and immediately stripped off. The transfer layer remained adhered only to the exposed, tacky areas. A negative cyan image of the original was obtained with a resolution of 1%–99% dots on the 60 lines/cm screen.

For the application of a protective layer, the image was exposed overall and a polyethylene sheet was laminated on it, bonding firmly with the image material.

EXAMPLE 2

The cyan, magenta, and yellow transfer materials required for making a four-color image were prepared as in Example 1 with the quantities given in Table 1

TABLE 1

|  | Cyan (g) | Magenta (g) | Yellow (g) |
|---|---|---|---|
| Pigment | 22.09 | 28.41 | 24.82 |
| Polystyrene of Example 1a) | 2.37 | 1.93 | 3.91 |
| Poly(ethyl acrylate) I of Example 1a) | 19.46 | 11.93 | 14.56 |
| Poly(ethyl acrylate) II of Example 1a) | 14.20 | 16.32 | 14.09 |
| Surfactant | 2.37 | 8.80 | 9.79 |
| CDM-HABI | 8.84 | 7.30 | 7.33 |
| Ethoxy-HABI | 16.49 | 13.58 | 13.68 |
| Methyl-DHP | 4.34 | 3.59 | 3.61 |
| Ethyl-DHP | 4.34 | 3.59 | 3.61 |
| Propyl-DHP | 4.34 | 3.59 | 3.61 |
| Stabilizer | 1.18 | 0.97 | 0.98 |

The pigments for the color transfer layers were:
a) Cyan - a mixture of a copper phthalocyanine pigment (C.I. 74160) and a magenta pigment (C.I. pigment red 123),
b) Magenta-a mixture of two magenta pigments (C.I. red 122 and pigment red 123),
c) Yellow-C.I. pigment yellow 117, and
d) Black-50 g C.I. pigment black 7, 40 g amorphous SiO$_2$, 107.4 g of an ethylene/vinyl acetate copolymer (18% vinyl acetate, tensile strength=5.9 N/mm2 by ASTMD-882), and 2.6 g surfactant, all milled together in a bead mill.

The solvent was 800 mL of a toluene/methyl ethyl ketone/xylene mixture (6:3:1). The composition was coated on a 60 μm thick polypropylene foam sheet according to DE-OS 37 06 528.

To prepare a four-color proof print, a negative tonable layer prepared according to Example 1a) was laminated, after the cover sheet was removed, on an image receptor. The laminated structure was exposed for 42 seconds through a halftone cyan color separation negative in a vacuum printing frame with a metal halide lamp (3,000 watts) at a distance of 95 cm. After the support was removed, the transfer material a) was laminated on the imagewise exposed layer and immediately stripped off. The transfer layer remained only on the exposed tacky areas, yielding a negative cyan image of the original.

A second exposure was made through the corresponding halftone magenta color separation. Transfer material b) was laminated on the imagewise exposed layer and stripped off. The transfer layer remained only on the exposed tacky areas, yielding a negative magenta image with overlapping color areas. The corresponding process steps were repeated for yellow and black. A four-color proof print with overlapping color areas was obtained with 1% –99% resolution on the 60 lines/cm screen, representing a realistic reproduction of the original.

EXAMPLE 3

To prepare double-layer materials, pigmented solutions of the cyan and magenta dyes according to Example 1a) of DE-B 39 41 493 were coated by doctor blade on an unpigmented base prepared according to Example 1a) and dried. Another unpigmented base according to Example 1a) was exposed through a halftone negative magenta color separation. After the cover sheet was removed, the double-layer magenta transfer sheet was laminated on and immediately stripped off. The double-layer material remained adhered only to the exposed tacky areas and a negative magenta image was obtained. A second exposure was made through a halftone cyan color separation. The double-layer cyan transfer sheet was laminated on and stripped off. The double-layer material remained adhered only to the exposed, tacky areas, yielding a two-color image with overlapping color areas.

EXAMPLE 4

A polyester sheet was coated with a colorless base layer about 2μm thick, according to Example 1a). A commercial, light-insensitive, pigmented sheet that melts on exposure to heat was laminated on it at 120° C. An unpigmented, photo-polymerizable layer according to Example 1 of EP-A 02 43 933 was exposed imagewise and the cover sheet was removed. The multilayer pigment sheet was laminated on at 120° C. and the support sheet was removed. A complete imagewise transfer resulted. The tacky areas of the imagewise exposed layer were covered with pigmented, light-insensitive coating and colorless, photosensitive coating.

EXAMPLE 5

Color overlays were prepared by applying photosensitive powdered toners as follows:

a) Preparation of Photosensitive Base Layer

To prepare a colorless base coating that becomes tacky on exposure, the following constituents were dissolved successively in methylene chloride, coated on a white pigmented polyester support, dried in an air stream, and covered with a transparent protective polypropylene sheet. Coating composition:

The following were dissolved successively in 114 g methylene chloride with stirring:

|  | g |
| --- | --- |
| Polystyrene from Example 1a) | 10.5 |
| CDM-HABI | 19.5 |
| Ethoxy-HABI | 36.6 |
| Mixture of various DHP's | 28.8 |
| Stabilizer | 2.6 |
| Poly(ethyl acrylate) I from Example 1a) | 28.5 |
| Poly(ethyl acrylate) II from Example 1a) | 23.7 |

The mixture of various DHP's was prepared in a single vessel by reacting at elevated temperature equimolar quantities (0.2 mole each) of propionaldehyde, butyraldehyde, and valeraldehyde in methanol with aqueous ammonia and adding 0.6 mole each of ethyl acetoacetate and t-butyl acetoacetate. The reaction product was diluted with diethyl ether, shaken with water, and the ether phase was dried. The DHP mixture was obtained as an oily residue by evaporating unreacted starting compounds and solvent in a vacuum.

b) Preparation of a Photosensitive Magenta Toner 8.5 g of a DHP mixture [according to 1a)] and 13 g ethoxy-HABI were dissolved in acetone and precipitated by pouring the solution in water. After drying, 8.0 g of the DHP/HABI mixture was mixed with 2.0 g of a magenta toner (MM 80-II from the Du Pont Co.) in a mill and finely divided.

c) Preparation of a Photosensitive Cyan Toner

A photosensitive toner was prepared as in 4b), except that 2.0 g of a cyan toner (CC 28 from the Du Pont Co.) were used instead of the magenta toner.

d) Toning with Photosensitive Toners

The photosensitive base layer of 4a) was exposed through an original having a transparent circle of 5 cm diameter (UV exposure in a commercial UV exposure device with 400 cycles). The base layer became tacky in the exposed area. After the protective layer was removed, toning with the toner of 4b) produced a magenta-colored overall circular area, the toner having been spread uniformly by rubbing with a wad of cotton until the surface was glossy.

The protective sheet was replaced and a second exposure was made so that about 50% of the circular area overlapped the previously toned circular area.

The exposed material was toned as previously described, except that the toner of 4c) was used. A violet blend color appeared in the overlapped circle segment, whereas the magenta color was retained in the non-overlapped circle segment and a cyan colored circle segment appeared in the newly exposed area of the base.

The protective cover was replaced and a third exposure was made through the circular original so that about 50% of the circular area overlapped proportionately the previously toned circular area and the remaining 50% was a freshly exposed area on the base.

The exposed material was toned as previously described, except that a light-insensitive yellow toner was used. (Cromalin ® Toner YY 2 from Du Pont Co.) In the newly formed circle segment that was without an overlay, an overall yellow area appeared, whereas in the newly overlaid areas, the expected blended colors appeared; cyan/yellow gave green, magenta/yellow gave orange, and a dark grayish brown color appeared where all three circle segments were overlaid.

Having described the invention, we now claim the following and their equivalents.

What is claimed is:

1. A process for preparing images comprising:
   A) applying a radiation-sensitive layer A having a tackiness that can be modified by irradiation with actinic radiation onto an image support;
   B) irradiating imagewise with actinic radiation the radiation-sensitive layer A, the tackiness of which is modified in predetermined areas;
   C) applying onto the irradiated layer A a toner that adheres to the tacky areas of the layer; and
   D) removing excess toner from the areas of the layer that are not to be toned.

2. The process according to claim 1, wherein after step (D), steps (B) through (D) are repeated at least once.

3. The process according to claim 1, wherein the radiation-sensitive material contains at least one photosensitive dihydropyridine compound or a photosensitive system of at least one hexaarylbisimidazole compound and a dihydropyridine compound or a thioamide or thiolactam.

4. The process according to claim 1 or 2, wherein the toner is a powdered toner.

5. The process according to claim 3, wherein the toner is a powdered toner.

6. The process according to claim 1, wherein the toner is in the form of a transfer layer present on a support which is brought into contact with the irradiated layer and the support is then stripped off.

7. The process according to claim 3, wherein the toner is in the form of a transfer layer present on a support which is brought into contact with the irradiated layer and the support is then stripped off.

8. The process according to claim 6, wherein the radiation-sensitive material having increasing tackiness on exposure with actinic radiation and the chromogenic material are present in separate layers on the support.

9. The process according to claim 6, wherein the radiation-sensitive material having increasing tackiness on exposure with actinic radiation and the chromogenic material are present in separate layers on the support.

10. The process according to claim 7, wherein the radiation-sensitive material having increasing tackiness on exposure with actinic radiation and the chromogenic material are present in separate layers on the support.

11. The process according to claim 6, wherein the support is a compressible material.

12. The process according to claim 6, wherein the support is a compressible material.

13. The process according to claim 7, wherein the support is a compressible material.

14. The process according to claim 1 or 2, wherein the radiation-sensitive layer A contains a radiation-sensitive material that increases the tackiness of layer A on irradiation with actinic radiation.

15. The process according to claim 4, wherein the radiation-sensitive layer A contains a radiation-sensitive material that increases the tackiness of layer A on irradiation with actinic radiation.

16. The process according to claim 6, wherein the radiation-sensitive layer A contains a radiation-sensitive material that increases the tackiness of layer A on irradiation with actinic radiation.

17. The process according to claim 14, wherein the radiation-sensitive material of layer A contains at least one photosensitive dihydropyridine compound or a photosensitive system of at least one hexaarylbisimidazole compound and a dihydropyridine compound or a thioamide or thiolactam.

18. The process according to claim 15, wherein the radiation-sensitive material of layer A contains at least one photosensitive dihydropyridine compound or a photosensitive system of at least one hexaarylbisimidazole compound and a dihydropyridine compound or a thioamide or thiolactam.

19. The process according to claim 16, wherein the radiation-sensitive material of layer A contains at least one photosensitive dihydropyridine compound or a photosensitive system of at least one hexaarylbisimidazole compound and a dihydropyridine compound or a thioamide or thiolactam.

* * * * *